United States Patent [19]
Jorgensen

[11] 4,034,871
[45] July 12, 1977

[54] ADAPTER FOR MOUNTING PRINTED CIRCUIT CARDS

[75] Inventor: Adam A. Jorgensen, Fairport, N.Y.

[73] Assignee: Stromberg-Carlson Corporation, Rochester, N.Y.

[21] Appl. No.: 381,960

[22] Filed: July 23, 1973

Related U.S. Application Data

[63] Continuation of Ser. No. 214,823, Jan. 3, 1972, abandoned.

[51] Int. Cl.² .......................................... H02B 1/04
[52] U.S. Cl. .................................. 211/41; 361/399
[58] Field of Search .......... 211/26, 41; 339/17 LM, 339/17 M, 66 M, 176 MP; 29/413; 317/101 DH

[56] References Cited

U.S. PATENT DOCUMENTS

| | | | |
|---|---|---|---|
| 3,144,709 | 8/1964 | Hansson et al. | 29/413 |
| 3,222,769 | 12/1965 | Le Plae | 29/413 |
| 3,254,400 | 6/1966 | Gordon | 29/413 |
| 3,566,193 | 2/1971 | Jorgensen et al. | 317/101 DH |
| 3,676,747 | 7/1972 | Jorgensen et al. | 317/101 DH |

FOREIGN PATENT DOCUMENTS 1,053,352  12/1966  United Kingdom ................ 211/41

Primary Examiner—Roy D. Frazier
Assistant Examiner—Thomas J. Holko
Attorney, Agent, or Firm—William F. Porter, Jr.

[57] ABSTRACT

A printed circuit card adapter for mounting on an elongated stud comprises a bar-like member having at least one surface area having a contour substantially conforming to the surface of the elongated stud upon which it is mounted. Guide means are disposed on the member for receiving an edge of a printed circuit board. The longitudinal axis of the guide means is disposed substantially parallel to the longitudinal axis of the member. An embodiment of the adapter employs a web to join together pairs of members to produce a strip comprising a plurality of adapters. Means are provided in the web for enabling one to readily divide the strip into one or more adapters as required.

10 Claims, 13 Drawing Figures

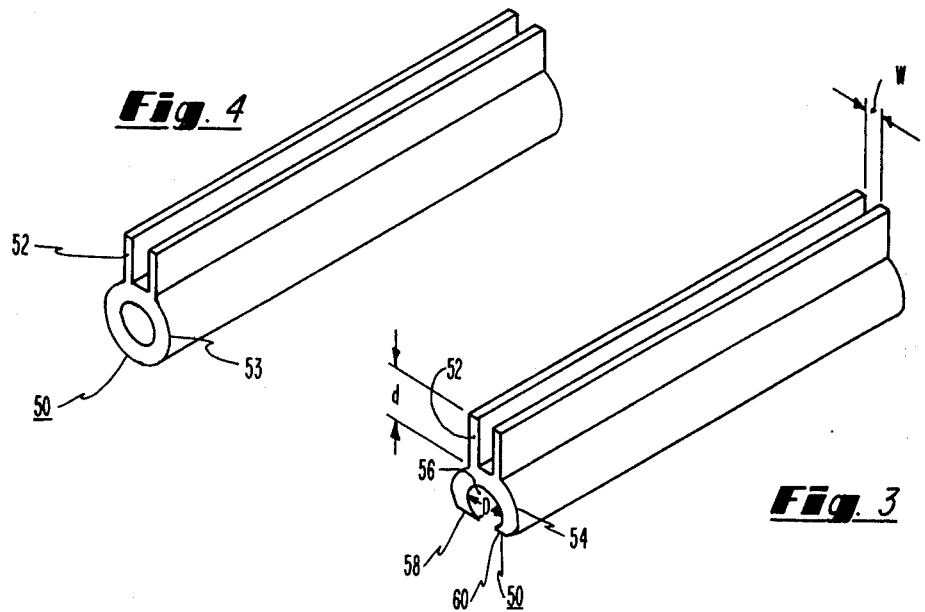
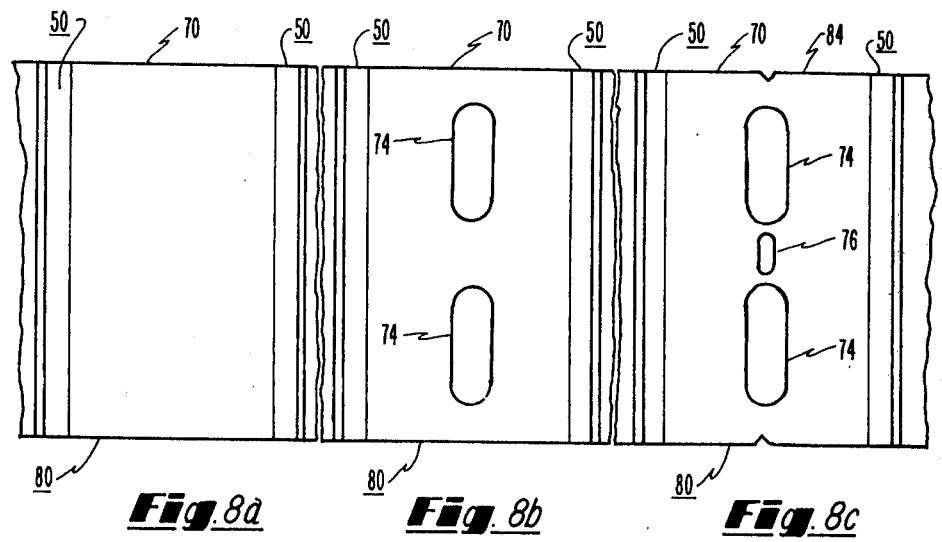
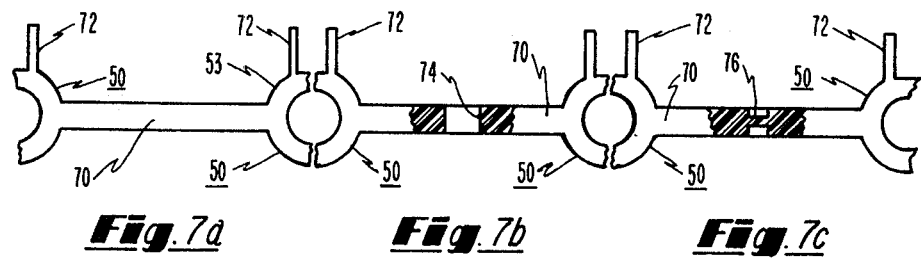

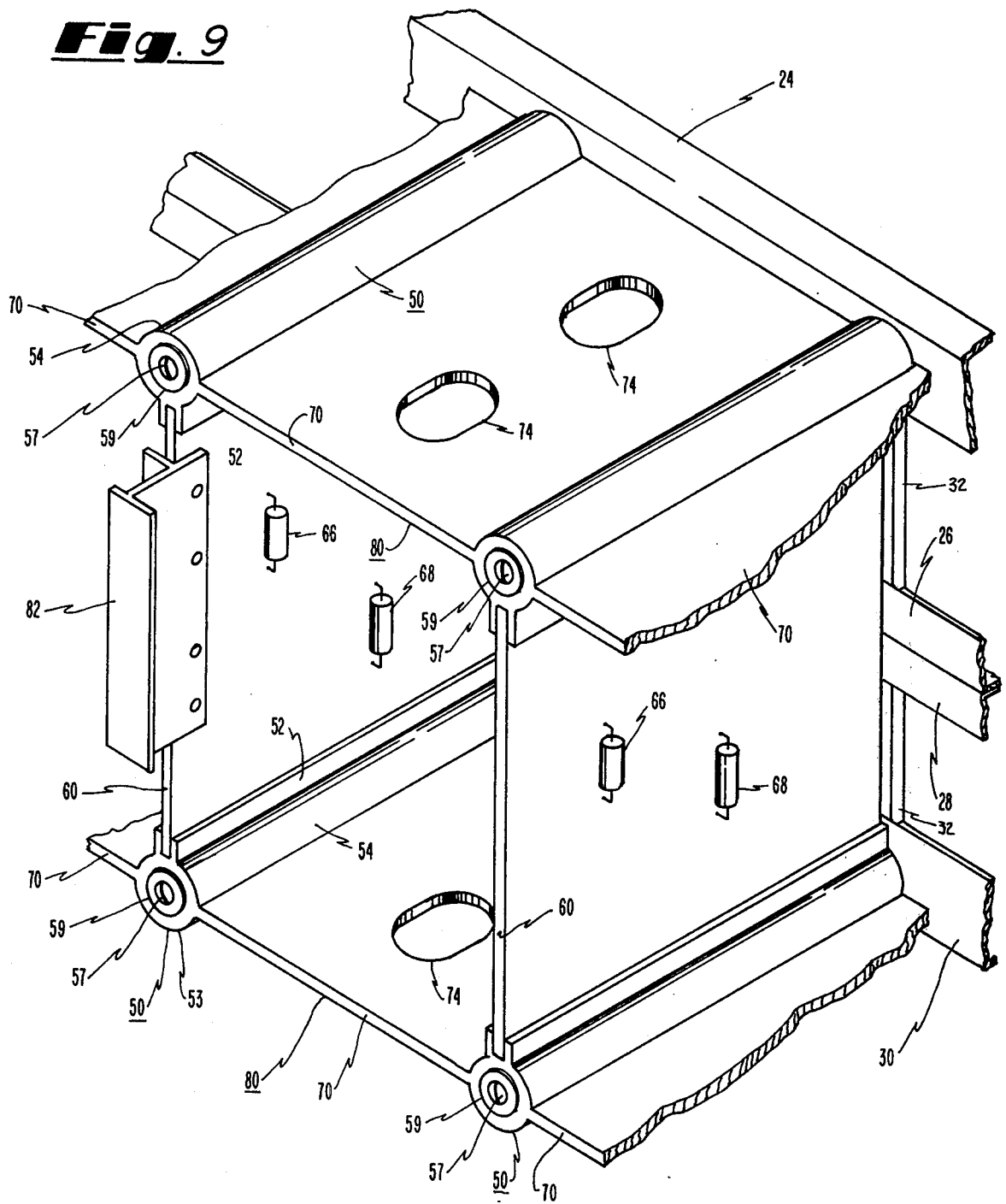

ADAPTER FOR MOUNTING PRINTED CIRCUIT CARDS

This application is a continuation of application Ser. No. 214,823, filed Jan. 3, 1972, now abandoned.

BACKGROUND OF THE INVENTION

The present invention relates to a printed circuit card guide adaptor suitable for use in a printed circuit card module.

In an effort to reduce the size of complex electronic systems, great attention has been focused through the years on the fabrication of printed circuit board or card modules which may be physically mounted in a closely spaced relationship to provide an extremely compact organization of plural circuits or systems. However, further efforts to additionally decrease the size of such modules have encountered difficulties with assembly of the printed circuit card arrangements, alignment of the elements, proper registration between the printed circuit cards and associated connector elements, and proper spacing and insulating between the respective circuits, among the numerous difficulties.

Printed circuit card modules have been provided in numerous forms in an attempt to overcome the aforementioned difficulties and also to provide for accessibility and ease of repair of the individual circuits included in the arrangement. Arrangements, such as the "book-type" module wherein the cards are positioned in a closely spaced relationship and hinged along a common edge so as to provide accessibility to the interior cards, much in the same manner as the pages of book, have been developed to satisfy the requirement of accessibility. Other arrangements have provided both horizontal and vertical stacks of cards oriented through more or less complicated spacing and aligning elements so as to provide proper spacing and alignment between the respective cards and the associated electrical connector elements.

However, in spite of the progress that has been made over the years in connection with such printed circuit card modules, difficulties relating to interchangeability of individual cards so as to provide simplified circuit modification, simplified assembly and disassembly for purposes of initial manufacture and subsequent repair, and accuracy in alignment between the respective cards and registration between the cards and the associated connector elements have proven to be ever present problems.

A recent improvement provided a printed circuit card stiffener frame and guide pin arrangement in association with a printed circuit card module which tends to more clearly achieve the aforementioned objectives than those of the more distant prior art. However, all printed circuit cards do not embody a stiffener frame. Ease of interchangeability of cards is greatly desirable and eagerly sought after by industry. Therefore, a means must be provided which enables one to achieve the ease of interchangeability of the printed circuit cards while still being able to benefit from the guide pin arrangement.

An object of this invention is to provide suitable means for enabling the attachment of printed circuit cards without stiffener frames attached thereto to prior art guide in arrangements.

Another object of this invention is to provide an adapter which is readily assembled on a prior art printed circuit card guide pin mounting arrangement, which will accept printed circuit cards devoid of stiffener frames without excessive flexing of the cards.

Other objects of this invention will, in part, be obvious and will, in part, appear hereinafter.

BRIEF DESCRIPTION OF THE INVENTION

In accordance with the teachings of this invention, there is provided a printed circuit card adapter for mounting on an elongated stud comprising an elongated bar-like member. The member has at least one surface area having a contour substantially conforming to the surface of the elongated stud to which it is to be mounted thereon. The longitudinal axis of the at least one surface coincides with the longitudinal axis of the stud when the guide is mounted thereon. A guide means for receiving an edge of a printed circuit card is disposed on the member and has a longitudinal axis which is substantially parallel to the longitudinal axis of the member. A further embodiment provides a plurality of adapters in strip form, each pair of adjacent adapters being joined together by a web. The web is further modified to provide adapters for circulating air therethrough and means to readily divide the strip form into one or more adapters as required.

BRIEF DESCRIPTION OF THE DRAWINGS

FIG. 3 is an isometric view of a printed circuit card guide adapter suitable for use in the assembly of FIG. 1 and made in accordance with the teachings of this invention;

FIG. 4 is an isometric view of an alternate embodiment of the adapter of FIG. 3;

FIG. 7a is an elevation view of a strip form of the adapter of this invention;

FIG. 7b is an elevation view of an alternate embodiment of the adapter of FIG. 7a;

FIG. 7c is an elevation view, partly in cross-section, of still another alternate embodiment of the adapter of FIG. 7a;

FIG. 8a is a planar view of the adapter of FIG. 7a;

FIG. 8b is a planar view of the adapter of FIG. 7b;

FIG. 8c is a planar view of the adapter of FIG. 7c, and

FIG. 9 is an isometric view of a printed circuit card assembly embodying the adapters shown in FIGS. 7b and 7c.

DESCRIPTION OF THE PREFERRED EMBODIMENT

Figure 1:
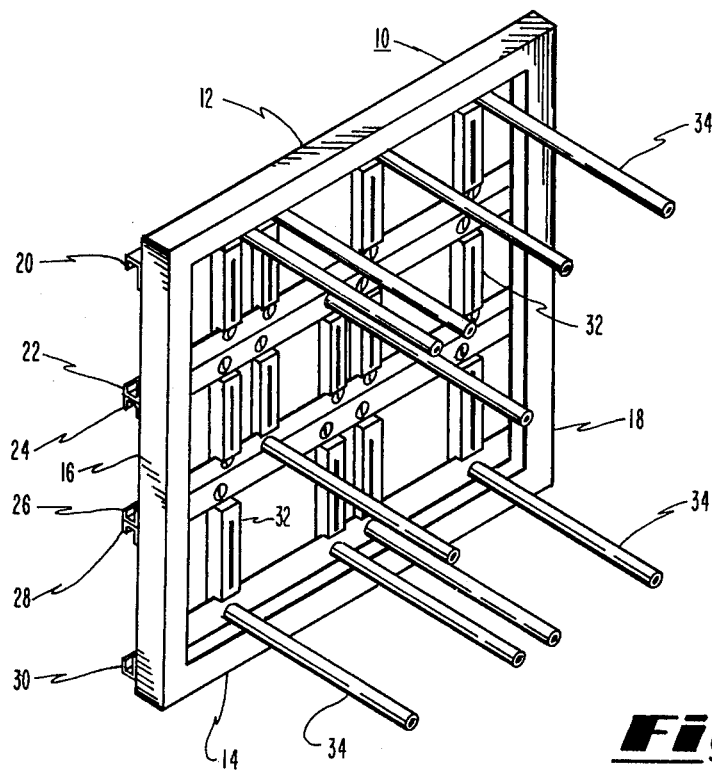
FIG. 1 is an isometric view of a prior art gate or shelf assembly.

With reference to FIG. 1, there is shown a prior art gate or shelf assembly 10 suitable for supporting printed circuit cards of varying length and width to provide a module arrangement of printed circuit cards in a compact assembly. The gate or shelf assembly 10 is substantially rectangular in configuration and has respective side portions 12, 14, 16 and 18. In addition, connector mounting bars 20, 22, 24, 26, 28 and 30 are secured to the rectangular gate assembly, serving as support elements for the connectors 32 and guide studs 34.

The connector mounting bars 20–30 are each provided with apertures along the length thereof which are aligned in the vertical direction so as to accommodate the fasteners for individual plug-in-type connectors 32 which are supported vertically in the frame to receive the terminal edge of associated printed circuit cards. The connectors 32 are located precisely on the gate assembly between the connector mounting bars in accordance with the desired size and location of the various printed circuit cards to be mounted in the module, which connectors are then secured in place by suitable fasteners. Also secured to the connector mounting bars 20–30 are the plurality of guide studs 34. The guide studs 34 are positioned at the ends of the connectors 32, or row of connectors 32, depending upon the size of the cards to be mounted in position thereat.

Figure 2:
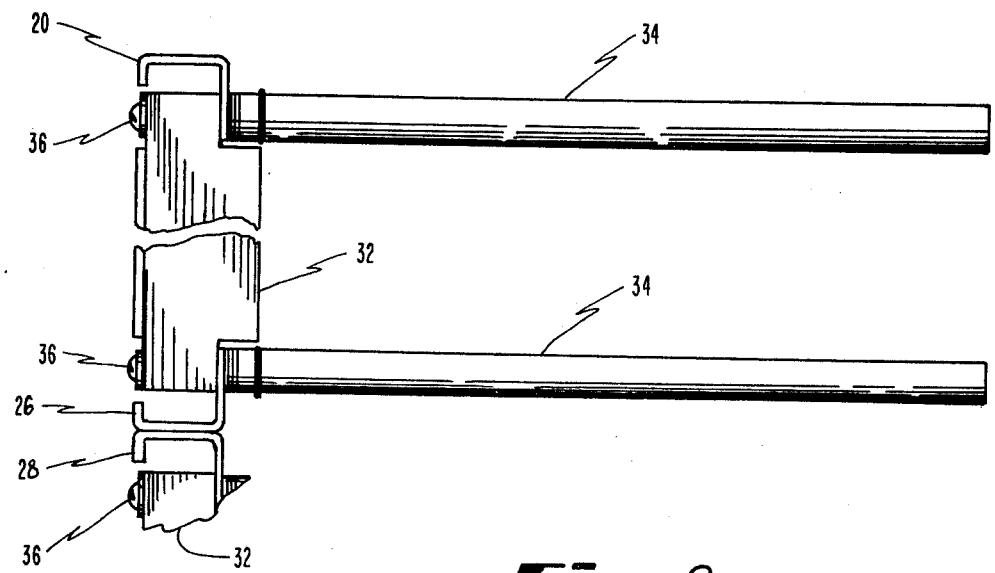
FIG. 2 is an elevation view of a portion of the assembly of FIG. 1 illustrating the guide stud arrangement therein.

Referring now to FIG. 2, there is shown a method of mounting the connector 32 and the guide studs 34 to the mounting bars 20–30. The guide studs 34 are provided in locations representing the upper and lower edges of the individual printed circuit cards to be mounted on the gate, or shelf assembly 10. The connector 32 and the guide studs 34 are assembled to the connector mounting bars 20–30 by common fastening means 36 such, for example, as machine screws and washers. In those instances where studs 34 are not employed, nuts are assembled to the fasteners 36 to secure the connectors 32 in place.

For a further discussion of the gate or shelf assembly 10, the various configurations of the guide studs 34 and the various printed circuit card mounting configurations possible employing channels attached thereto for mounting the card in the frame via the studs 34, the reader is directed to the U.S. Pat. No. 3,566,193 and the copending patent application, "Printed Circuit Card Arrangement", Ser. No. 117,026, filed by Adam A. Jorgensen, et al.

With reference to FIG. 3, there is shown a printed circuit card guide adapter 50 for use with the guide studs 34 when the printed circuit board does not include any mounting channels. The card guide adapter 50 comprises an upper body or guide means 52 defining a U-shape or channel-like configuration and a lower body or bar-like member 54 suitably formed to enable the adapter 50 to be readily affixed to, and removed from, the studs 34. Preferably, the bodies 52 and 54 are integral with each other for ease of manufacture thereof. The U-shape configuration extends parallel to the longitudinal axis of the adapter 50. The width ($w$) of the channel is variable and is dependent on the thickness of the printed circuit card which is to be inserted therein. The overall width ($w$) is slightly larger, approximately 1/16 inch, than the card thickness to allow easy movement of the card in the channel.

The adapter 50 may be made of a metal or a non-metal. Preferably, for manufacturing purposes, the adapter is made of material such, for example, as an electrically insulating thermosetting resinous material suitable for a molding operation.

The lower body 54 is designed to provide a slip-fit between the mating parts of the adapter 50 and the stud 34. The lower body 54 is designed to be assembled to a stud 34 of any geometric cross-section configuration such, for example, as a circle, an oval, a square, a rectangle, and the like. The longitudinal axis of the lower body 54 is substantially coincident with the longitudinal axis of the stud 34 when mounted thereon. For illustrative purposes of this invention only, the body 54 will be described as being adapted to fit a stud 34 having a circular cross-section. The body 54 has an inner cylindrical surface 56 of a circular cross-section of a diameter D which is slightly large than the cross-section diameter of the stud 34. The diameter D can be smaller as shown in FIG. 3 to provide a tight, or snap fit. The body 54 does not have to fully encircle the stud 34, but preferably should encircle at least one half of the surface area of the stud 34. To prevent the adapter 50 from moving too freely on the stud 34, the ends 58 and 60 of the body 54 may be designed to grip the stud 34 requiring the adapter to be snapped into plane when assembled to the stud 34. An alternate embodiment is illustrated in FIG. 4 wherein an adapter 51 has a tubular body 53 which completely encircles the stud 34 upon which it is mounted and the body 52 having the channel-like configuration is integral with the body 53.

Figure 5:
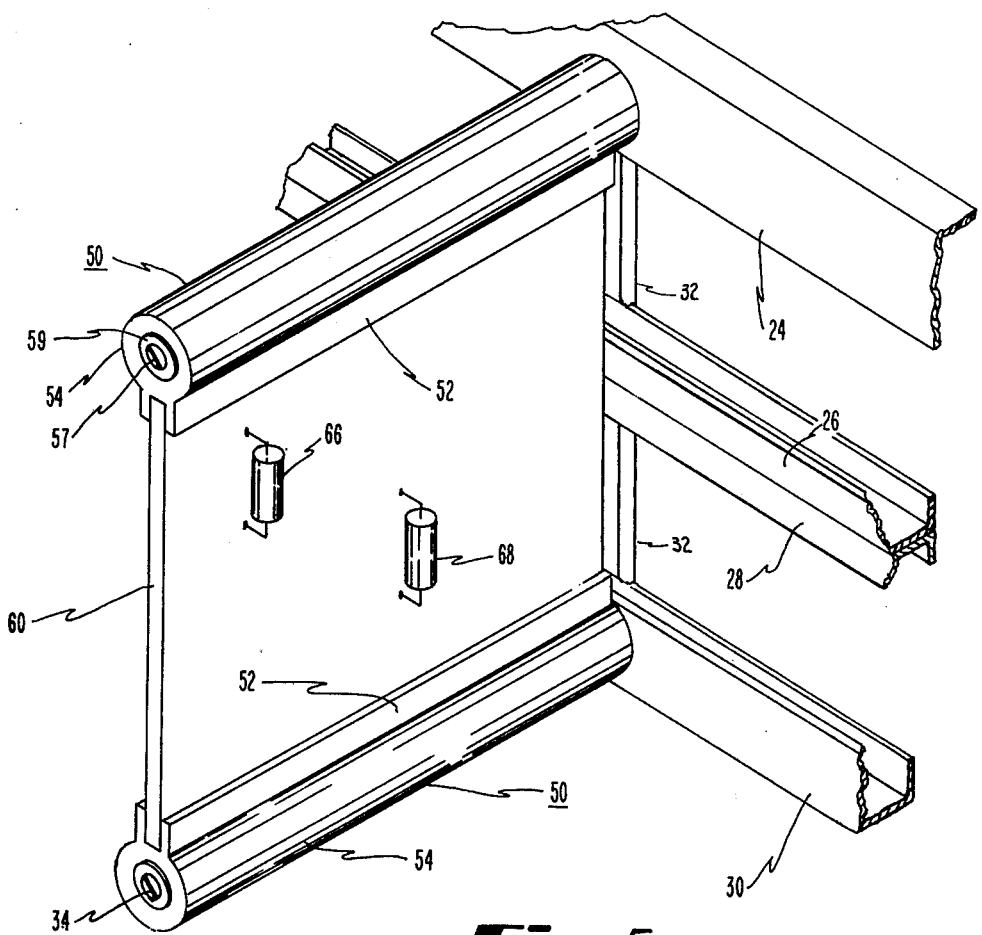
FIG. 5 is an isometric view showing the utility of the adapter of FIG. 4 with the assembly of FIG. 1.
Figure 6:
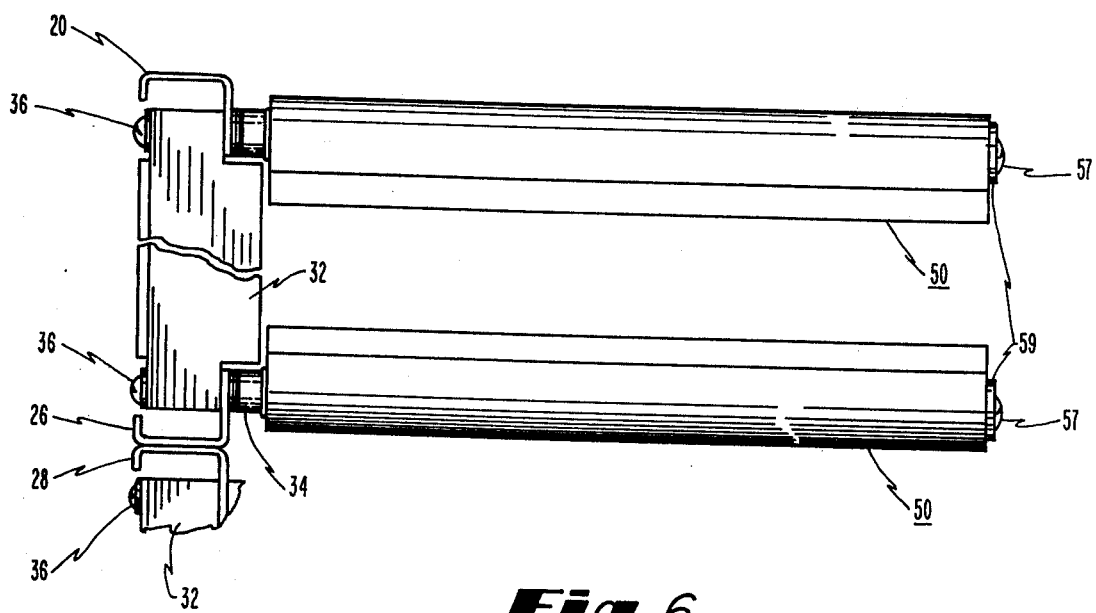
FIG. 6 is an elevation view illustrating a means for fastening the adapter of FIG. 4 to the guide stud.

Referring now to FIG. 5, there is shown an embodiment of the use of a pair of the adapters 50 of the type illustrated in FIG. 4 to mount a printed circuit card 60 to a gate or shelf assembly 10. An adapter 50 is mounted on a stud 34 by inserting the stud 34 in one end of an axially disposed tubular aperture extending the length of the body 53 and sliding the adapter 50 over the stud 34 until it abuts against the respective connector mounting bar supporting the stud 34. The channel-like configuration of the adapters 50 are oriented opposed to each other to accept and restrict the printed circuit card 60 mounted therebetween. The arrangement enables edge contact mounted on one end of the card 60 to be properly oriented with, and readily connected to, the corresponding plug-in-type connector 32. The card 60 may be of any size. If of a small size, it is assembled to adapters 50 mounted on studs 34 between mounting bars 20 and 22, 24 and 26, or 28 and 30 (FIG. 1). If of a size which is a maximum for the gate or shelf assembly 10, the card 60 is mounted between a pair of adapters 50 embracing the space defined by the mounting bars 20 and 30. As shown in FIG. 5 and also in FIG. 6, a threaded fastener 57 may engage the stud 34 to assist in mounting the adapter 50 on the stud 34 as well as to retain the adapter 50 in place after assembly. The fastener assists in forcing the adapter 50 into an abutting relationship with the assembly 10. A washer-like member 59 may be employed in conjunction with the threaded member 57 engaging the stud 34 to assemble the adapter 50 to the stud 34 and to retain the adapter 50 in place. The washer and fastener assist in forcing the adapter 50 into an abutting relationship with the assembly 10.

With reference to FIGS. 7a, 7b, 7c, 8a, 8b and 8c, the adapter 50 is suitable for manufacturing in a plurality of 2 or more adapters 50 in a strip form 80. Adjacent pairs of adapters 50 are connected to each other by an integral web portion 70. The material comprising the web portion 70 is the same as the material comprising the adapter 50. As shown in FIGS. 7a and 8a, the adapter strips are produced with as many multiples of the adapters as desired or as feasible for manufacturing purposes. The strip form is ideally suited for the mounting of a plurality of cards 60 mutually adjacent to, but spaced apart from, each other in a modular assembly concept in the gate assembly 10. The strip configuration embodying the web portion 70 keeps each of the adapters properly oriented so that the side walls 72 of the channel configuration are aligned substantially perpendicular to the plane of the web portion 70 as shown in FIGS. 7a, 7b and 7c. In order to provide adequate circulation of air to dissipate the heat generated by the components 66 and 68 mounted on the cards 60, one or more apertures 74, are provided extending entirely through the thickness of the web member 70 as shown in FIG. 7b or FIG. 8b. Air may be circulated, either naturally or by force, in and about the cards 60.

With reference to FIGS. 7c and 8c, there is shown a further embodiment of the printed circuit card mounting adapter of this invention. When the adapters 50 are made in a strip form 80 comprising a plurality of spaced adapters 50, and each adjacent pair of adapters 50 is connected together by the integral web portion 70, means are provided to enable one to readily divide the strip into individual adapters or into portions containing a plurality of two or more adapters to meet specific requirements for a plurality of mounting cards 60 in the gate or shelf assembly 10. Each aperture 74 is preferably of an oval configuration whereby its longitudinal axis is substantially perpendicular to the edge of the web portion 70. One or more regions of reduced thickness is disposed along the center line of the axis of the one or more apertures 74 and the adjacent edge of the web section 70. The region 76 also has an oval configuration in which the longitudinal or major axis of the region 76 is aligned with the longitudinal axis of the aperture 74. This configuration for the web section 70 therefore enables one to easily snap the strip into the required number of adapters 50 as required. Additionally, at least one of the edges 82 and 84 of the web section 70 may be provided with a notch 86 to aid in dividing the strip into the necessary groups of adapters. The apex of the notch 86 is substantially aligned with the longitudinal axis of the aperture 74 and the region 76 of reduced thickness.

Referring now to FIG. 9, there is shown a modular assembly of printed circuit cards embodying the use of a plurality of strip forms 80. The studs 34 are mounted on the mounting bars 24 and 30 of the gate assembly 10. A strip form 80 is assembled on the studs 34 attached to the bar 24 and a strip form 80 is assembled on the studs 34 attached to the bar 30. A plurality of washer-like members 59 and threaded members 57 are employed to retain the strip forms 80 in place. Printed circuit cards 60 are mounted in the opposed guide channels of each pair of oppositely oriented adapters 50. The reference numbers of FIG. 9 which are common to the reference numbers of the previous figures are the same items and function in the same manner as previously described. A handle 82 may be attached to a card 60 to facilitate the insertion and the withdrawal of the card 60 from the modular assembly as well as to provide a means for mounting test jacks and the like thereon.

What is claimed is:

1. A printed circuit card adapter for mounting on a cantilevered elongated stud, said adapter comprising:
   a plurality of elongated bar-like members each having at least one inner surface area extending the entire length of said elongated member and having a generally tubular shape substantially conforming to an outer surface of the elongated stud on which said member is slideably mounted and a longitudinal axis coinciding with the longitudinal axis of said stud when mounted thereon;
   guide means disposed on each of said members and integral therewith adapted for slideably receiving an edge of a printed circuit board, the longitudinal axis of said each of said guide means being disposed substantially parallel to the longitudinal axis of the respective bar-like member and being essentially the same length as the stud, and
   a web interconnecting pairs of elongated bar-like members to form a strip of a plurality of elongated members whereby the longitudinal axis of all the elongated bar-like members are a common plane and are substantially parallel to each other, and wherein all the guide means on said members extend in the same direction from said common plane.

2. A printed circuit card adapter as defined in claim 1 wherein:
   said webs are formed with at least one aperture extending therethrough.

3. A printed circuit card adapter as defined in claim 2 wherein:
   said web is formed with at least one area of reduced thickness providing a means for readily separating said bar-like members.

4. A printed circuit card adapter as defined in claim 3 wherein:
   said apertures have a generally oval configuration wherein the major axis of the aperture is disposed substantially parallel to the longitudinal axes of said elongated bar-like members, and
   said area of reduced thickness is aligned with the major axis of said at least one aperture.

5. A printed circuit card adapter as defined in claim 4 wherein:
   said web is formed with a notch in one edge of said web having an apex substantially aligned with the major axes of said at least one aperture and said area of reduced thickness.

6. A printed circuit card adapter for mounting on a plurality of cantilevered elongated studs comprising:
   a plurality of bar-like members, each of said members having at least one inner surface area having a contour substantially conforming to the outer surface of the respective elongated stud on which said member is slideably mounted and a longitudinal axis coinciding with the longitudinal axis of said respective stud when mounted thereon;
   guide means disposed on each of said members and integral therewith adapted for slideably receiving an edge of a printed circuit board, the longitudinal axis of said guide means being disposed substantially parallel to the longitudinal axis of said bar-like member and being essentially the same length as the stud, and
   a web interconnecting pairs of said bar-like members to form a strip of a plurality of members whereby the longitudinal axes of the members are in a common plane and are substantially parallel to each other, and wherein all the guide means extend in the same direction away from said common plane.

7. A printed circuit card adapter as defined in claim 6 wherein:
   each of said webs are formed with at least one aperture extending therethrough.

8. A printed circuit card adapter as defined in claim 7 wherein:
   each of said webs is formed with at least one area of reduced thickness providing a means for readily separating said bar-like members.

9. A printed circuit card adapter as defined in claim 8 wherein:

said apertures have a generally oval configuration wherein the major axis of the aperture is disposed substantially parallel to the longitudinal axis of said members, and said area of reduced thickness is aligned with the major axis of said at least one aperture.

10. A printed circuit card adapters as defined in claim 9 wherein:

each of said webs is formed with a notch in one edge of said web, said notch having an apex substantially aligned with the major axes of said at least one aperture and said area of reduced thickness.

* * * * *